United States Patent [19]

Manoliu

[11] Patent Number: 5,010,034

[45] Date of Patent: Apr. 23, 1991

[54] CMOS AND BIPOLAR FABRICATION PROCESS USING SELECTIVE EPITAXIAL GROWTH SCALABLE TO BELOW 0.5 MICRON

[75] Inventor: Juliana Manoliu, Palo Alto, Calif.

[73] Assignee: National Semiconductor Corporation, Santa Clara, Calif.

[21] Appl. No.: 320,011

[22] Filed: Mar. 7, 1989

[51] Int. Cl.[5] ........................................... H01L 21/20
[52] U.S. Cl. ............................ 437/89; 148/DIG. 11; 148/DIG. 26; 148/DIG. 31; 156/613; 437/59; 437/64; 437/90
[58] Field of Search ............... 148/DIG. 2, 11, 26, 148/30, 31, 76, 82, 83, 151, 33, 33.2; 156/610–614; 427/248.1, 255.1; 437/40, 31, 51, 59, 64, 81, 89, 90, 165

[56] References Cited

U.S. PATENT DOCUMENTS

| | | | |
|---|---|---|---|
| 3,305,913 | 2/1967 | Loro | 437/157 |
| 3,635,772 | 1/1972 | Pestie et al. | 437/149 |
| 3,698,077 | 10/1972 | Dahlberg | 437/157 |
| 3,788,904 | 1/1974 | Haraszti | 437/149 |
| 4,004,954 | 1/1977 | Tshudy et al. | 437/89 |
| 4,099,998 | 7/1978 | Feno et al. | 437/149 |
| 4,101,350 | 7/1978 | Possley et al. | 437/89 |
| 4,177,095 | 12/1979 | Nelson | 437/149 |
| 4,551,909 | 11/1985 | Cogan et al. | 437/149 |

FOREIGN PATENT DOCUMENTS

| | | | |
|---|---|---|---|
| 48-968 | 3/1983 | Japan | 437/157 |
| 0131748 | 8/1983 | Japan | 437/89 |
| 0204576 | 9/1987 | Japan | 437/89 |

OTHER PUBLICATIONS

Sze, *VLSI Technology*, McGraw-Hill Book Co., New York, N.Y., 1983, pp. 169–170.

Primary Examiner—Olik Chaudhuri
Assistant Examiner—William Bunch
Attorney, Agent, or Firm—Townsend and Townsend

[57] ABSTRACT

A CMOS and bipolar fabrication process wherein a silicon dioxide layer initially formed over a silicon substrate is etched for forming separate collector and base/emitter regions for a bipolar device, and PMOS and NMOS regions for corresponding PMOS and NMOS devices. Buried layer implants are preformed using a minimum number of masks, and then an epitaxial layer is grown over the exposed portions of the silicon substrate. The silicon dioxide walls between the devices provide full dielectric isolation between the devices, as well as between the collector and base/emitter regions of the bipolar device. Nonetheless, the oxide wall between the collector and base/emitter of the bipolar device is sufficiently small to allow the buried layer implants to joint under the wall for forming a conventional buried layer for the bipolar device. Because of the oxide walls, the minimum distance between devices may be 0.5 microns or less.

30 Claims, 2 Drawing Sheets

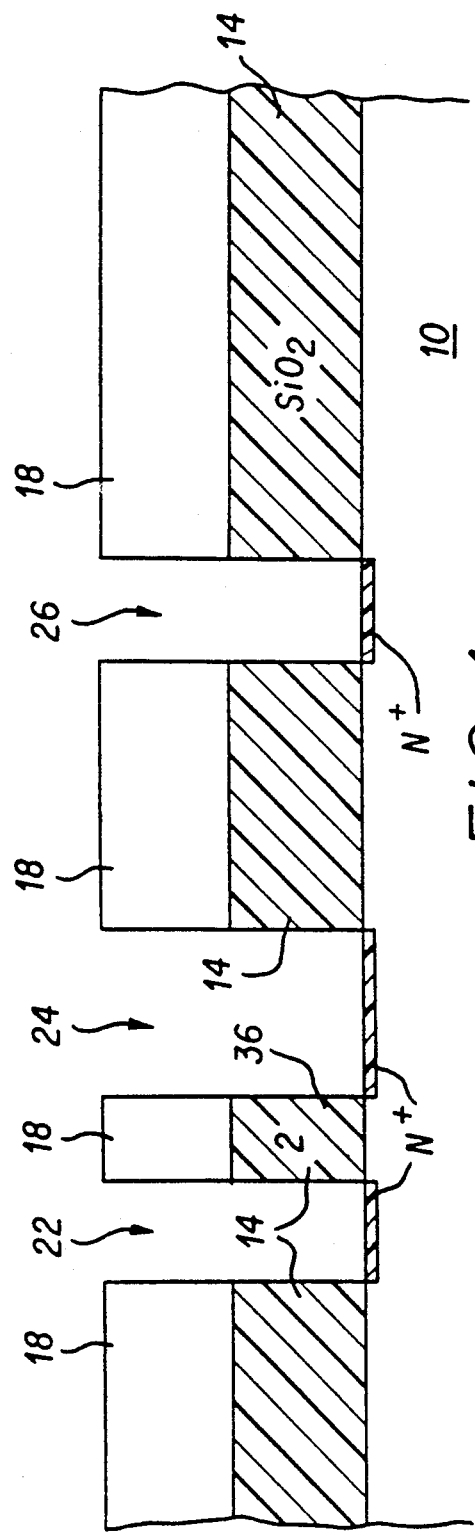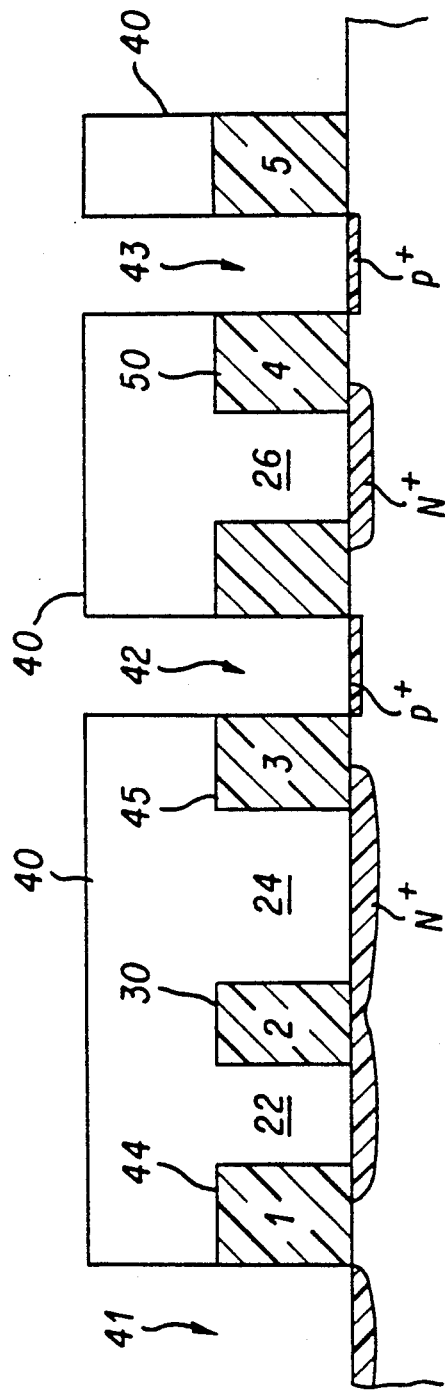

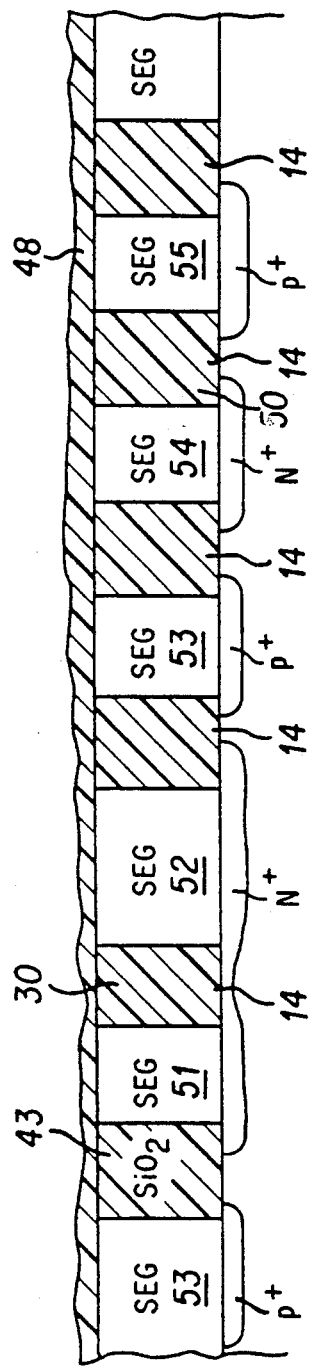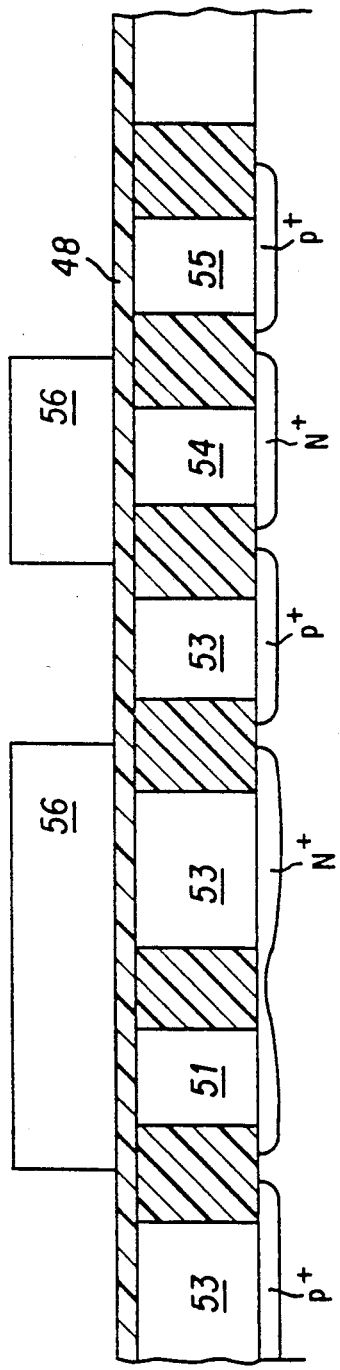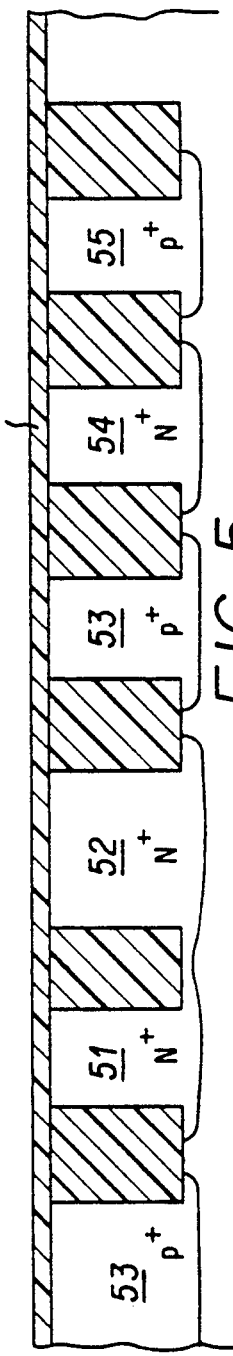

CMOS AND BIPOLAR FABRICATION PROCESS USING SELECTIVE EPITAXIAL GROWTH SCALABLE TO BELOW 0.5 MICRON

BACKGROUND OF THE INVENTION

1. Field of the Invention

This invention relates to semiconductor device fabrication methods and, more particularly, to a CMOS and bipolar fabrication process using selective epitaxial growth.

2. Description of the Related Art

As device geometries get smaller, well tried technologies become inadequate for isolating devices of the same or opposite conductivity type. For example, the widely used LOCOS (isoplanar) scheme requires too much silicon area for geometries below one micron, due to the bird's beak encroachment. In addition, latch-up considerations in CMOS prevent putting opposite type devices in very close proximity unless more complex processing is added.

Current state-of-the-art one to two micron level approaches to CMOS isolation include the use of trenches and epitaxial buried layers. Trench isolation has the disadvantage of requiring very complex and costly processing, and it requires some other type of oxide isolation for the majority of the chip's surface (typically LOCOS). Additionally. MOS transistors cannot be set directly against a trench wall because of degradation of device characteristics, thus increasing the area consumed by one transistor. Epitaxial buried layer isolation, while somewhat effective, still has a lower limit of approximately 2.5 micrometers for PMOS to NMOS spacing due to junction breakdown and punch-through.

Recently. CMOS isolation by selective epitaxial growth (SEG) has been proposed. In one method, not necessarily in the prior art, a silicon substrate is etched to form openings in the substrate, and insulators are formed on the side walls of the openings. Thereafter, the substrate is masked and doped to a chosen conductivity type, and an epitaxial layer is grown to fill the openings. A final LOCOS isolation then is performed. The disadvantages of this method are the requirement of etching into the silicon surface and the requirement of LOCOS isolation with the inherent bird's beak encroachment.

In another technique, also not necessarily in the prior art, a silicon dioxide layer is formed over a silicon substrate, and the silicon dioxide layer is etched for forming openings extending to the substrate. The openings are filled by growing epitaxial layers having a selected conductivity type (e.g., N-type) on the substrate. This creates doped wells in which devices of a particular type may be constructed. The wells then are covered by thin thermal oxide layers to protect them from later process steps. The process then is repeated to form wells having an opposite conductivity type (e.g., P-type). Thereafter, the thin oxide layers over the previously formed wells are stripped. Although this method does not require LOCOS isolation, it must be implemented with multiple SEG steps.

SUMMARY OF THE INVENTION

The present invention is directed to a relatively simple front-end process for isolating semiconductor devices wherein the process requires only one SEG step, provides twin buried layers which may be controlled independently, and uses a simple thermal oxidation step for isolation between devices. Active P and N regions are separately formed with self-aligned implants, and with fewer masking steps than conventional techniques. Unlike devices isolated by trenches, the isolation width can be any dimension above the resolution of the patterning tool for MOS devices of the same type, and the resolution of the patterning tool plus one registration tolerance for opposite type devices. Thus, if 0.5 micron is the resolution of the patterning tool, 0.5 micron isolation between same-type devices is achieved, and the process is scalable well into the submicron region. At submicron levels, no other presently known technique can provide a minimum device pitch of twice the resolution of the patterning tool with a planarized surface without substantially more complex processing.

For bipolar devices, the method according to the present invention minimizes collector-base capacitance through the use of oxide isolated collectors while also using a bipolar buried layer, whereas the independent P+ and N+ buried layers minimize the collector-to-substrate capacitance. Punch-through problems are eliminated because of full oxide isolation between devices. Finally, the front end of this process is compatible with the most advanced CMOS and bipolar backend device fabrication processes, such as silicided source-drain-gate areas and contacts/posts overlapping on field oxide for MOS devices, and a polyemitter or a polybase and emitter for bipolar devices.

In one embodiment of the present invention, a silicon dioxide layer is formed over a silicon substrate. The silicon dioxide layer is etched for forming separate collector and base/emitter regions for a bipolar device, and PMOS and NMOS regions for corresponding PMOS and NMOS devices. Buried layer implants are performed, and an epitaxial layer is grown over the exposed portions of the silicon substrate. The silicon dioxide walls between the devices provide full dielectric isolation between the devices as well as between the collector and base/emitter regions of the bipolar device. Nonetheless, the oxide wall between the collector and base/emitter of the bipolar device is sufficiently small to allow the buried layer implants to join under the wall for forming a conventional buried layer for the bipolar device. Because of the oxide walls, the minimum distance between devices may be 0.5 microns or less.

BRIEF DESCRIPTION OF THE DRAWINGS

FIGS. 1-5 illustrate the method according to the present invention for forming CMOS and bipolar devices using selective epitaxial growth.

DETAILED DESCRIPTION OF THE PREFERRED EMBODIMENTS

FIG. 1 shows one embodiment of a silicon substrate 10 after undergoing preliminary processing according to the present invention. The substrate material is P-type 100 with 100 flat orientation and resistivity greater than 10 ohm-cm. The flat orientation is preferable to achieve the best selectively grown epitaxial layers with minimal faceting and stress. The orientation also helps to reduce fixed charges along the vertical sidewalls of the oxide isolation regions.

First, a silicon dioxide layer 14 is thermally grown to a thickness of from approximately 0.8 to 1.5 microns by placing substrate 10 in an oxygen environment at 1000° C. for approximately 300 minutes, making certain that the oxidation cycle includes conventional denuded zone formation steps. This ensures that the selectively grown epitaxial layer will not have stacking faults along the horizontal surface. Thereafter, a photoresist layer 18 is deposited and developed for forming the openings shown. The portions of silicon dioxide layer 14 beneath the openings in photoresist layer 18 then are etched vertically to the surface of substrate 10 by Reactive Ion Etching (RIE) to form openings 22, 24, and 26. Openings 22 and 24, together with an oxide wall 30 therebetween, define a bipolar region, and opening 26 defines a PMOS region.

Using photoresist layer 18 as a mask, arsenic or arsenic and phosphorous ions are implanted in succession without tilting the wafers in the implanter. In this embodiment, all implants prior to epitaxial growth are performed without wafer tilt. The self-aligned implant in openings 22 and 24 is used to form a buried layer and an N-well for the bipolar device. Opening 22 is used for constructing the collector of the bipolar device, and opening 24 is used to construct the base and emitter of the bipolar device. The self-aligned implant in opening 26 is used to form a buried layer and an N-well for the PMOS device. The concentration of arsenic is approximately $5 \times 10^{15}$ to $1 \times 10^{16}$ atoms/cm$^2$, and it is implanted with an energy of approximately 100 KeV. The concentration of phosphorous is approximately $5 \times 10^{13}$ to $5 \times 10^{14}$ atoms/cm$^2$, and it is implanted with an energy of approximately 150 KeV. The arsenic implant ensures low resistance of the implanted regions, whereas the faster diffusing phosphorous species ensures formation of the N-wells for the PMOS and bipolar devices.

Next, photoresist layer 18 is removed, and an anneal is performed at 1000° C. in an inert atmosphere, such as nitrogen, for approximately 60 minutes. This eliminates the implant damage prior to SEG. The anneal also creates side diffusion of the phosphorous and arsenic implants to ensure that the buried layers beneath openings 22 and 24 join under oxide wall 30. Preferably, oxide wall 30 has a width of 0.5 microns (e.g., definable by E-beam) or less. If oxide wall 30 is wider, a longer arsenic diffusion may be required prior to epitaxial growth to ensure that the doped regions beneath openings 22 and 24 join.

An alternative to successive arsenic and phosphorous implants is to implant the arsenic, remove photoresist layer 18, anneal and diffuse the arsenic, and then implant phosphorous, taking advantage of the masking of silicon dioxide layer 14 to selectively implant only in the exposed silicon regions.

As shown in FIG. 2, a photoresist layer 40 is deposited and developed. The exposed portions of silicon dioxide layer 14 beneath the openings in photoresist layer 40 are vertically etched to the surface of substrate 10 by RIE to form openings 41, 42, and 43. Then, boron is implanted to a dose of approximately $2 \times 10^{13}$ to $2 \times 10^{14}$ atoms/cm$^2$ at an energy of approximately 120 KeV and photoresist layer 40 is removed. The implant in openings 41 and 42 is used to form a guard ring around the bipolar device. The bipolar device is separated from the guard ring by oxide walls 44 and 45. The implant in opening 43 is used to ensure a continuous P-well for an NMOS structure after the process is complete. The PMOS device is isolated from the NMOS device by an oxide wall 50, thus providing full dielectric isolation between opposite type MOS transistors. An added benefit of the boron implant is the lowering of substrate resistance $R_S$ which is beneficial in latch-up suppression.

Although the P and N regions are separately formed, only two masking steps have been required. This eliminates one masking step from conventional techniques wherein a mask is required for active region definition and for each implant. Additionally, the process according to the present invention avoids the necessity of dealing with a photoresist mask in peaks and valleys of the active regions.

The minimum distance between two adjacent NMOS devices is 0.5 microns or the resolution of the patterning tool. The distance between two adjacent PMOS devices is also 0.5 microns, since they can share the same N-well. If a PMOS device or another bipolar device is directly adjacent to the bipolar device (i.e., no guard ring), wall 45 preferably is wider by 0.4 to 0.6 microns than wall 30 to ensure isolation of the PMOS or the second bipolar device from the adjacent bipolar device. The minimum width for oxide wall 50, which forms the isolation region between the NMOS and PMOS devices, is the larger of (a) the minimum resolution of the patterning tool plus one registration tolerance, or (b) two registration tolerances. Thus, in the future, when both registration tolerances and resolution are reduced, this technology can be scaled below 0.5 microns, with the limit for isolation width then being an acceptable value of threshold voltage of the oxide isolation region.

By separating the regions of arsenic and boron implants, the bipolar collector-substrate capacitance is substantially reduced. The adjustment of this capacitance is by boron and phosphorous implant doses, the width of oxide wall 44, and total heat treatment included in the process. By allowing a wider separation between NMOS and NPN bipolar devices (assuming an NMOS device is located to the left of the bipolar device), this capacitance can be the absolute minimum. On the other hand, some designs may not require an NPN bipolar device next to an NMOS device, thus ensuring a low collector-to-substrate capacitance.

As shown in FIG. 3, undoped epitaxial silicon is selectively grown to the thickness of the remaining portions of silicon dioxide layer 14, 24, 26, 41, 42, and 43. This may be accomplished by a five minute in situ hydrogen bake at 1000° C. and 25 torr, followed by SEG deposition at 850°-950° C. and 25 torr in a hydrogen dichlorosilane and hydrogen chloride ambient to minimize faceting. This forms a collector region 51 in opening 22, a base/emitter region 52 in opening 24, a guard ring region 53 in opening 41 and 42, a PMOS region 54 in opening 26, and an NMOS region 55 in opening 43. Although guard ring region 53 is shown as separate regions in cross section, it is actually a continuous region encircling collector region 51 and base/emitter region 52. Thereafter, a thin silicon dioxide layer 48 is grown to a thickness of approximately 200-300 angstroms to alleviate the stress at the epi-isolation oxide interface. Oxide layer 48 also is used as a sacrificial oxide for gate oxide integrity improvement.

Proceeding to FIG. 4, a photoresist layer (not shown) is deposited and developed for exposing collector region 51, base/emitter region 52, and PMOS region 54. The exposed regions then are implanted with phosphorous to a concentration of approximately $1 \times 10^{12}$ to $4 \times 10^{12}$ atoms/cm$^2$ at an energy of 150 KeV for setting the N-well impurity profile at the surfaces of the P-channel devices and bipolar devices if necessary. The photoresist layer is removed, and a new photoresist layer 56 is deposited and developed to expose guard ring region 53 and NMOS region 55. The exposed regions then are implanted with boron for setting the impurity profile for the bipolar guard ring and the P-well for the N-channel devices. In some cases, photoresist layer 56 may not be necessary, and a blanket $V_T$ implant may be all that is required to set the correct P-channel and N-channel threshold voltages and to dope the bipolar guard rings.

Next, substrate 10 is placed in an inert environment at 1050° C. for approximately 60 minutes so that the substrate buried layers join with their respective N-well and P-well surface implants. After the drive-in, a $V_T$ implant is performed with $BF_2$ to a concentration of $1 \times 10^{12}$ to $3 \times 10^{12}$ atoms/cm$^2$. The thin sacrificial oxide layer 48 then is removed, and a gate oxide layer 60 having a thickness of 120-150 angstroms is grown, as shown in FIG. 5. This thin oxidation is the only oxidation step that the impurities will see, and thus segregation and depletion of boron on the sidewalls of isolation regions are minimized. No birds-beak encroachment is encountered in this process; thus, defined active and isolation dimensions will be the true electrical dimensions of the device and can be 0.5 micron or even less.

After the gate oxidation step, conventional gate material deposition and definition follow. The gate material can be polysilicon, silicide, or a combination of the two. For 0.5 micron devices, P+ polysilicon for P-channels and N+ polysilicon for N-channels are desirable. This is accomplished by doping the polysilicon at the time of the source/drain implants. The two types of polysilicon can be shorted by a silicide or a metal strap. At the time of the source/drain implantation, contacts to the N-well and substrate can be implemented, although they are not shown in these figures. These contacts are presumed to be in planes perpendicular to the plane of the cross sections. Sidewall spacers on gates are formed, and source-drain-gate silicidation is performed. Posts or unguarded contacts can be used for minimizing the interconnect real estate.

A guard ring should be formed for each bipolar transistor, but the precision of the present process allows the guard ring to be accurately spaced to provide very high performance.

After gate oxide layer is grown, the base is implanted, and base/emitter contacts (e.g., polysilicon buried contacts) are formed. After gate oxide layer 48 is grown, and before the N-well mask and implant, a collector sink mask, phosphorous implant (in collector region 5) to a concentration of $1 \times 10^{15}$ to $1 \times 10^{16}$ atoms/cm$^2$ and a drivein may be performed for performance improvement.

While the above is a complete description of a preferred embodiment of the present invention, various modifications may be employed. For example, bipolar devices may be omitted. Consequently, the scope of the invention should not be limited except as properly described in the claims.

What is claimed is:

1. A method of constructing a semiconductor structure comprising the steps of:
   growing a layer of silicon dioxide on a silicon substrate;
   etching a first opening in the silicon dioxide layer, the first opening exposing a first region of the substrate;
   etching a second opening in the silicon dioxide layer in close proximity to the first opening and separated therefrom by a first wall, the second opening exposing a second region of the substrate:
   implanting a first conductivity type impurity into the first and second regions of the substrate:
   growing an epitaxial layer over the first and second regions of the substrate for forming corresponding first and second epitaxial regions; and
   heating the substrate for causing the first conductivity type impurity in the first and second regions of the substrate to join beneath the first wall.

2. The method according to claim 1 further comprising the steps of:
   implanting first conductivity type impurity into the epitaxial layer prior to heating the substrate.

3. The method according to claim 2 wherein the heating step further comprises the step of heating the substrate for causing the first conductivity type impurity in the first and second regions of the epitaxial layer to contact the first conductivity type impurity in the corresponding first and second region of the substrate.

4. The method according to claim 3 wherein the epitaxial layer growing step further comprises the step of simultaneously growing the epitaxial layer over the first and second regions of the substrate.

5. The method according to claim 4 further comprising the steps of
   forming a collector of a bipolar transistor in the first epitaxial region; and
   forming a base and emitter of a bipolar transistor in the second region.

6. The method according to claim 4 further comprising the step of etching a third opening in the silicon dioxide layer for exposing a third annular region encircling the first and second regions of the substrate; and
   implanting second conductivity type impurity into the third region of the substrate.

7. The method according to claim 6 further comprising the steps of:
   growing an epitaxial layer over the third region of the substrate simultaneously with the growing of the epitaxial layer over the first and second regions of the substrate for forming a third, annular epitaxial region: and
   implanting second conductivity type impurity into the third epitaxial region.

8. The method according to claim 7 further comprising the step of heating the substrate for causing the second conductivity type impurity in the third region of the substrate to contact the second conductivity type impurity in the third epitaxial region.

9. The method according to claim 7 further comprising the steps of:
   etching a fourth opening in to the silicon dioxide layer, the fourth opening exposing a fourth region of the substrate: and
   implanting first conductivitY type impurity into the fourth region of the substrate.

10. The method according to claim 8 further comprising the steps of:
    growing an epitaxial layer over the fourth region of the substrate simultaneously with the growing of the epitaxial layer over the first and second regions of the substrate for forming a fourth epitaxial region;
    implanting first conductivity type impurity into the fourth epitaxial region; and
    heating the substrate for causing the first conductivity type impurity in the fourth region of the substrate to contact the first conductivity type impurity in the fourth epitaxial region.

11. The method according to claim 9 further comprising the step of forming a first channel type MOS device in the fourth epitaxial region.

12. The method according to claim 8 further comprising the steps of:
   growing an epitaxial layer over the fourth region of the substrate simultaneously with the growing of the epitaxial layer over the first and second region of the substrate for forming a fourth epitaxial region;
   implanting second conductivity type impurity into the fourth epitaxial region; and
   heating the substrate for causing the second conductivity type impurity in the fourth region of the substrate to contact the second conductivity type impurity in the fourth epitaxial layer.

13. The method according to claim 12 further comprising the step of forming a first channel type MOS device in the fourth epitaxial region.

14. The method according to claim 13 further comprising the steps of:
   etching a fifth opening into the silicon dioxide layer, the fifth opening exposing a fifth region of the substrate; and
   implanting first conductivity type impurity into the fifth region.

15. The method according to claim 14 further comprising the steps of:
   growing an epitaxial layer over the fifth region of the substrate simultaneously with the growing of the epitaxial layer over the first and second regions of the substrate for forming a fifth epitaxial region;
   implanting first conductivity type impurity into the fifth epitaxial region; and
   heating the substrate for causing the first conductivity type impurity in the fifth region of the substrate to contact the first conductivity type impurity in the fifth epitaxial region.

16. The method according to claim 15 further comprising the step of forming a second channel type MOS device in the fifth epitaxial region.

17. A method of constructing a semiconductor structure comprising the steps of:
   growing a layer of silicon dioxide on a silicon substrate;
   etching, with a first mask, a first opening in the silicon dioxide layer, the first opening exposing a first region of the substrate;
   thereafter, implanting a first conductivity type impurity into the first region of the substrate;
   thereafter, etching, with a second mask, a second opening in the silicon dioxide layer in close proximity to the first opening and separated therefrom by a first wall, the second opening exposing a second region of the substrate, wherein the width of the first wall between the first and second regions is less than one micron;
   thereafter, implanting a second conductivity type impurity into the second regions of the substrate; and
   heating the substrate for causing the first and second conductivity type impurities to diffuse into the first and second regions of the substrate.

18. The method according to claim 17 further comprising the step of, prior to the heating step, growing an epitaxial layer over the first and second regions of the substrate for forming corresponding first and second epitaxial regions.

19. The method according to claim 17 wherein the heating step further comprises the step of heating the substrate for causing the first conductivity type impurity to diffuse into the substrate for forming a buried layer.

20. The method according to claim 17 wherein the heating step further comprises the step of heating the substrate for causing the first and second conductivity type impurities to diffuse into the first and second epitaxial regions of the substrate for forming corresponding first and second active regions.

21. The method according to claim 20 further comprising the steps of, prior to the heating step:
   implanting first conductivity type impurity into the first epitaxial region: and
   implanting second conductivity type impurity into the second epitaxial region.

22. The method according to claim 21 wherein the heating step comprises the step of heating the substrate for causing the first and second conductivity type impurities in the first and second epitaxial regions and the first and second impurities in the first and second regions of the substrate to diffuse toward each other for forming corresponding first and second active regions.

23. The method according to claim 22 wherein the epitaxial layer growing step comprises the step of growing an epitaxial layer over the first and second regions of the substrate for forming corresponding first and second epitaxial regions that are coplanar with the silicon dioxide layer.

24. A method of constructing a semiconductor structure comprising the steps of:
   growing a layer of silicon dioxide on a silicon substrate;
   etching, with a first mask, a first opening in the silicon dioxide layer, the first opening exposing a first region of the substrate;
   thereafter, implanting a first conductivity type impurity into the first region of the substrate;
   thereafter, etching, with a second mask, a second opening in the silicon dioxide layer in close proximity to the first opening and separated therefrom by a first wall, the second opening exposing a second region of the substrate, wherein the width of the first wall between the first and second regions is not greater than 0.5 microns;
   thereafter, implanting a second conductivity type impurity into the second regions of the substrate; and
   heating the substrate for causing the first and second conductivity type impurities to diffuse into the first and second regions of the substrate.

25. The method according to claim 24 further comprising the step of, prior to the heating step, growing an epitaxial layer over the first and second regions of the substrate for forming corresponding first and second epitaxial regions.

26. The method according to claim 25 wherein the heating step further comprises the step of heating the substrate for causing the first conductivity type impurity to diffuse into the substrate for forming a buried layer.

27. The method according to claim 25 wherein the heating step further comprises the step of heating the substrate for causing the first and second conductivity type impurities to diffuse into the first and second epitaxial regions of the substrate for forming corresponding first and second active regions.

28. The method according to claim 27 further comprising the steps of, prior to the heating step:
implanting first conductivity type impurity into the first epitaxial region; and
implanting second conductivity type impurity into the second epitaxial region.

29. The method according to claim 28 wherein the heating step comprises the step of heating the substrate for causing the first and second conductivity type impurities in the first and second epitaxial regions and the first and second impurities in the first and second regions of the substrate to diffuse toward each other for forming corresponding first and second active regions.

30. The method according to claim 20 wherein the epitaxial layer growing step comprises the step of growing an epitaxial layer over the first and second regions of the substrate for forming corresponding first and second epitaxial regions that are coplanar with the silicon dioxide layer.

* * * * *